United States Patent
Shen et al.

(10) Patent No.: US 9,691,901 B2
(45) Date of Patent: Jun. 27, 2017

(54) SEMICONDUCTOR DEVICE

(71) Applicant: UNITED MICROELECTRONICS CORP., Hsin-Chu (TW)

(72) Inventors: Wen-Jiun Shen, Yunlin County (TW); Chia-Jong Liu, Ping-Tung County (TW); Chung-Fu Chang, Tainan (TW); Yen-Liang Wu, Taipei (TW); Man-Ling Lu, Taoyuan (TW); I-Fan Chang, Hsinchu (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 38 days.

(21) Appl. No.: 14/873,214

(22) Filed: Oct. 2, 2015

(65) Prior Publication Data
US 2017/0098708 A1  Apr. 6, 2017

(51) Int. Cl.
*H01L 29/78* (2006.01)
*H01L 29/06* (2006.01)
*H01L 29/165* (2006.01)
*H01L 29/08* (2006.01)
*H01L 27/088* (2006.01)

(52) U.S. Cl.
CPC ........ *H01L 29/7848* (2013.01); *H01L 27/088* (2013.01); *H01L 29/0688* (2013.01); *H01L 29/0847* (2013.01); *H01L 29/165* (2013.01)

(58) Field of Classification Search
CPC .......... H01L 29/7848; H01L 29/66636; H01L 29/6656; H01L 21/823418; H01L 21/823814; H01L 29/41783
See application file for complete search history.

(56) References Cited

U.S. PATENT DOCUMENTS

| 7,838,372 | B2 | 11/2010 | Han | |
|---|---|---|---|---|
| 9,034,706 | B2 | 5/2015 | Liu | |
| 2007/0054447 | A1* | 3/2007 | Tai | H01L 29/7834 438/197 |
| 2007/0254414 | A1* | 11/2007 | Miyanami | H01L 29/165 438/149 |
| 2009/0001418 | A1* | 1/2009 | Kim | H01L 29/0847 257/190 |
| 2009/0289379 | A1* | 11/2009 | Han | H01L 21/823807 257/368 |

(Continued)

OTHER PUBLICATIONS

Shen, Title of Invention: Semiconductor Device and Method for Fabricating the Same, U.S. Appl. No. 14/324,252, filed Jul. 7, 2014.

*Primary Examiner* — Bac Au
(74) *Attorney, Agent, or Firm* — Winston Hsu

(57) ABSTRACT

A semiconductor device includes a substrate, a gate structure, a sidewall spacer, and an epitaxial layer. The gate structure is disposed on the substrate, and the substrate has at least one recess disposed adjacent to the gate structure. The sidewall spacer is disposed on at least two sides of the gate structure. The sidewall spacer includes a first spacer layer and a second spacer layer, and the first spacer layer is disposed between the gate structure and the second spacer layer. The epitaxial layer is disposed in the recess, and the recess is a circular shaped recess. A distance between an upmost part of the recess and the gate structure is less than a width of the sidewall spacer.

12 Claims, 9 Drawing Sheets

(56) References Cited

U.S. PATENT DOCUMENTS

| | | | |
|---|---|---|---|
| 2011/0024801 A1* | 2/2011 | Cheng | H01L 29/165 257/255 |
| 2011/0079820 A1* | 4/2011 | Lai | H01L 21/3247 257/190 |
| 2011/0183496 A1* | 7/2011 | Kaneko | H01L 21/6835 438/473 |
| 2014/0217519 A1* | 8/2014 | Qin | H01L 29/7833 257/408 |
| 2015/0064870 A1 | 3/2015 | Shin | |
| 2015/0069466 A1 | 3/2015 | Chang | |
| 2015/0076621 A1 | 3/2015 | Tsai | |
| 2015/0104913 A1* | 4/2015 | Liu | H01L 21/823821 438/229 |
| 2015/0137261 A1 | 5/2015 | Lee | |
| 2015/0187905 A1* | 7/2015 | Cai | H01L 29/6681 257/288 |
| 2015/0318282 A1* | 11/2015 | Rodder | H01L 21/823418 257/392 |
| 2015/0357436 A1* | 12/2015 | Shen | H01L 29/66636 257/190 |
| 2016/0276344 A1* | 9/2016 | Choi | H01L 27/0886 |

\* cited by examiner

SEMICONDUCTOR DEVICE

BACKGROUND OF THE INVENTION

1. Field of the Invention

The present invention relates to a semiconductor device, and more particularly, to a semiconductor device including a circular shaped recess with a relatively smaller distance between the recess and a corresponding gate structure for improving the performance of the semiconductor device.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as a silicon germanium (SiGe) epitaxial layer in a silicon substrate. As the lattice constant of the SiGe epitaxial layer is greater than the lattice constant of the silicon substrate thereby producing stress to the channel region of a PMOS transistor, the carrier mobility is increased in the channel region and speed of MOS transistor is improved accordingly. Conversely, a silicon carbide (SiC) epitaxial layer could be formed in silicon substrate to produce tensile stress for gate channel of an NMOS transistor.

Decreasing the distance between the epitaxial layer and the corresponding gate is one approach to improve the device performance because of the larger epitaxial volume and the higher stain to the channel. However, the edge of the epitaxial layer is generally aligned with the outmost surface of the sidewall spacer on the gate in the conventional structure, and the sidewall spacer must have a specific width to be consumed in the etching process of forming recesses between the gates. In other words, there is a limitation of reducing the width of the sidewall spacer for the purpose of decreasing the distance between the epitaxial layer and the corresponding gate.

SUMMARY OF THE INVENTION

According to the claimed invention, a semiconductor structure is provided. The semiconductor device includes a substrate, a gate structure, a sidewall spacer, and an epitaxial layer. The gate structure is disposed on the substrate, and the substrate has at least one recess disposed adjacent to the gate structure. The sidewall spacer is disposed on at least two sides of the gate structure. The sidewall spacer includes a first spacer layer and a second spacer layer, and the first spacer layer is disposed between the gate structure and the second spacer layer. The epitaxial layer is disposed in the recess, and the recess is a circular shaped recess. A distance between an upmost part of the recess and the gate structure is less than a width of the sidewall spacer.

According to the semiconductor structure in the present invention, a distance between the epitaxial layer and the gate structure is reduced and a volume of the epitaxial layer is increased because the distance between the upmost part of the recess and the gate structure is less than the width of the sidewall spacer. The strain of the gate channel becomes higher and the performance of the semiconductor structure is enhanced accordingly without reducing the width of the sidewall spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a manufacturing method of a semiconductor structure according to a first embodiment of the present invention, wherein FIG. 2 is a schematic drawing in a step subsequent to FIG. 1, and FIG. 3 is a schematic drawing in a step subsequent to FIG. 2.

DETAILED DESCRIPTION

Figure 1:
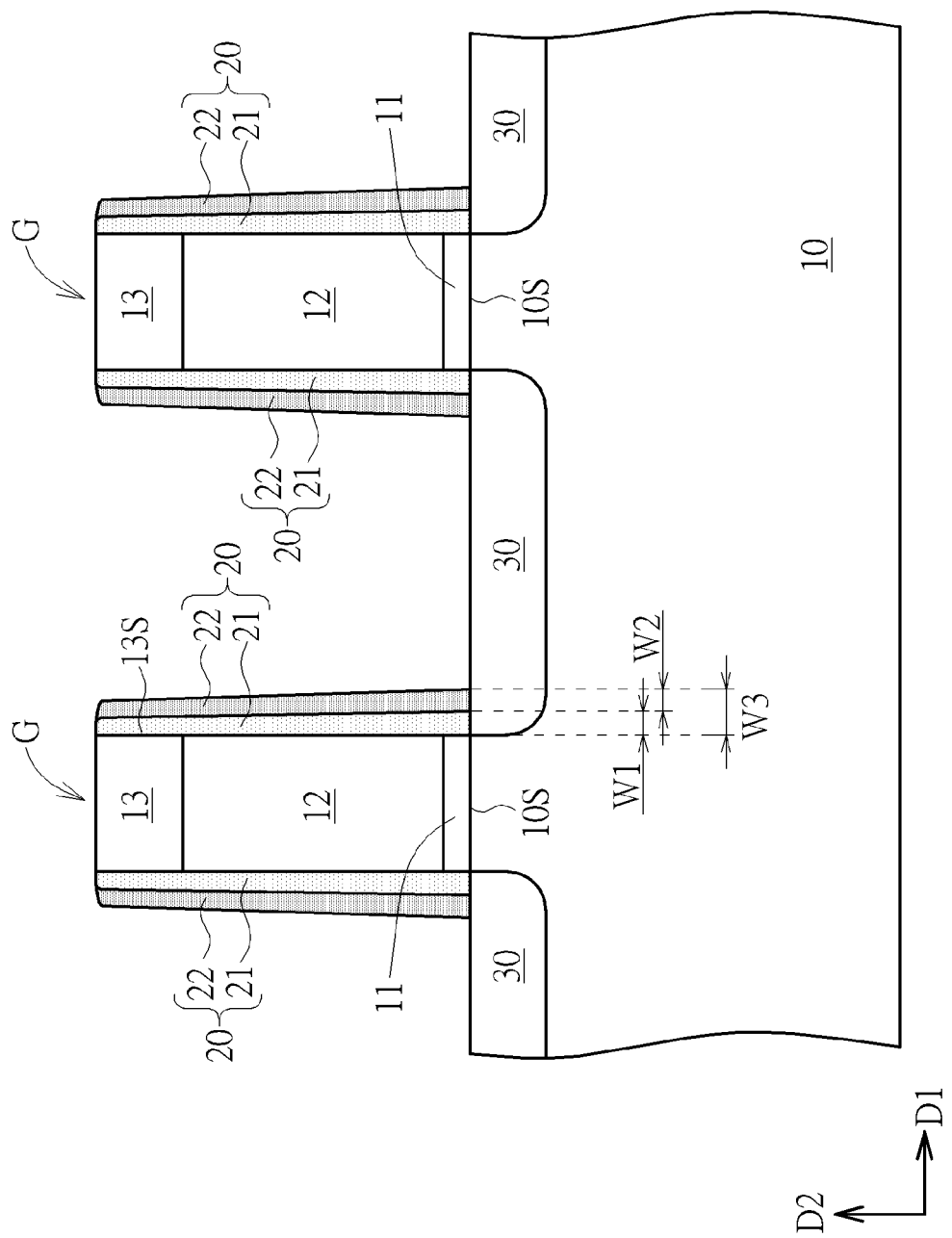
Figure 2:
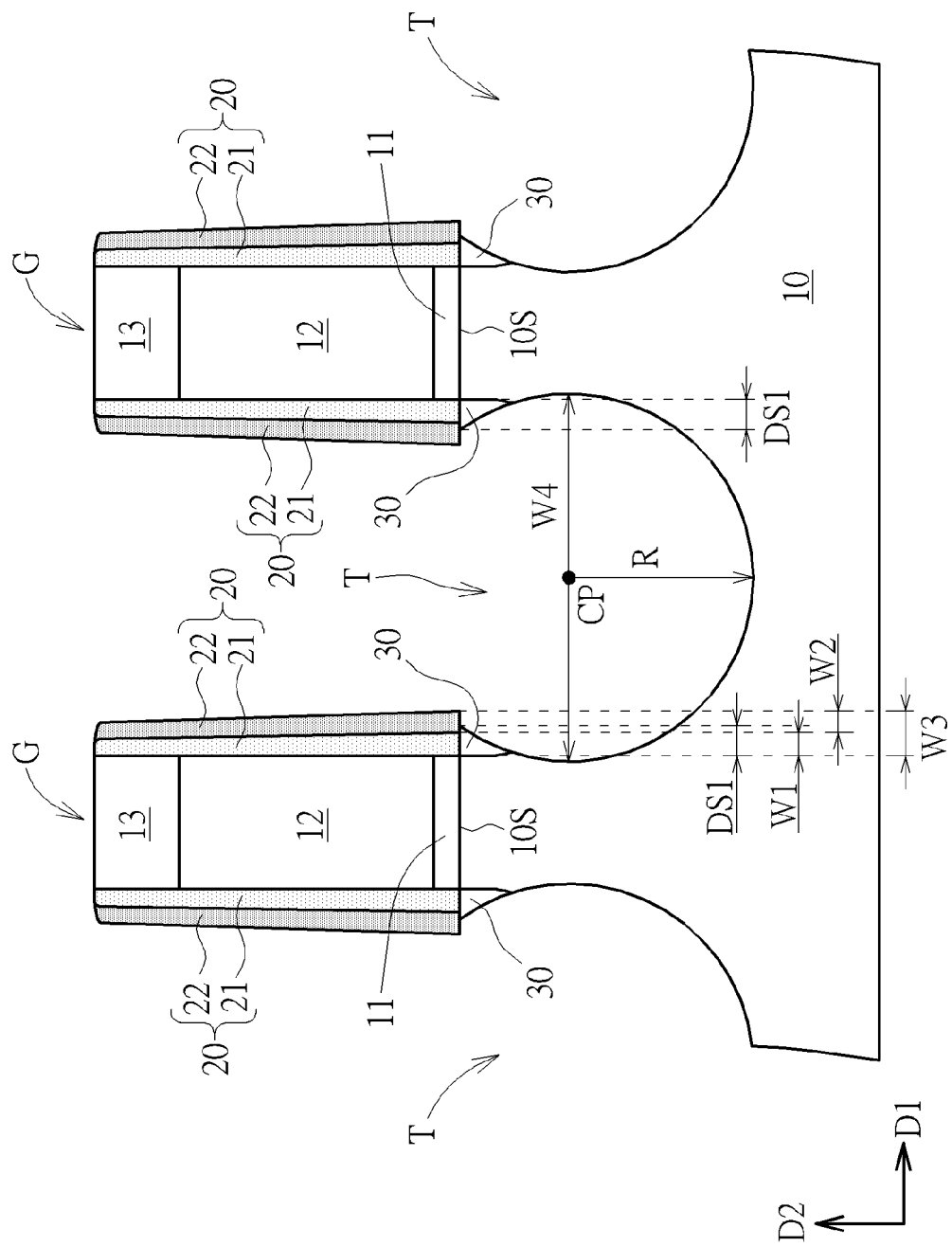
Figure 3:
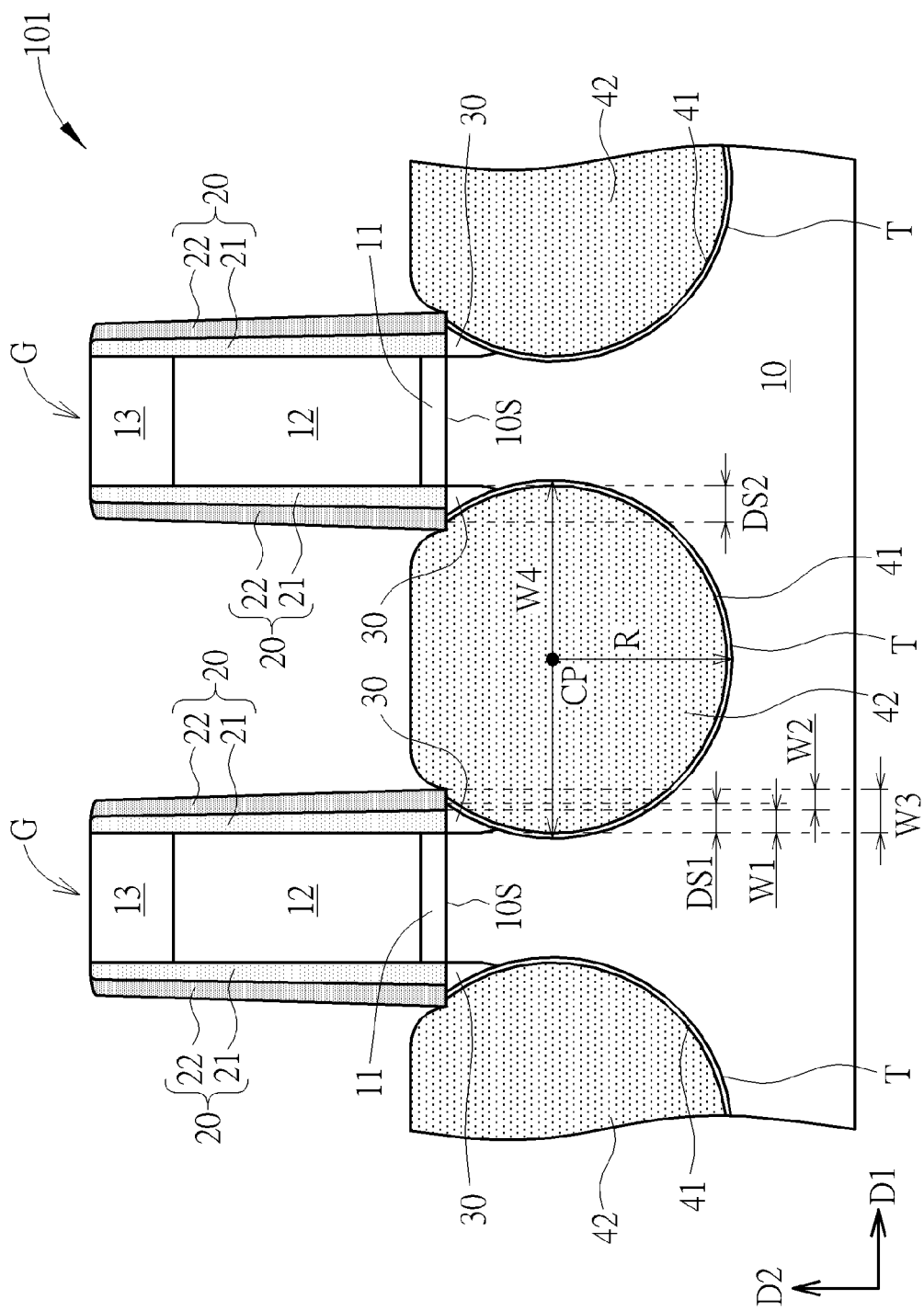

Please refer to FIGS. 1-3. FIGS. 1-3 are schematic drawings illustrating a manufacturing method of a semiconductor structure according to a first embodiment of the present invention. The manufacturing method of the semiconductor structure in this embodiment includes the following steps. As shown in FIG. 1, a substrate 10 is first provided, and at least one gate structure G is formed on the substrate 10. In this embodiment, the formation of the gate structure G could be accomplished by sequentially forming a gate dielectric layer, a gate material layer, and a hard mask layer on the substrate 10, conducting a pattern transfer process by using a patterned resist (not shown) as mask to partially remove the hard mask layer, the gate material layer, and the gate dielectric layer through single or multiple etching processes, and stripping the patterned resist for forming at least one gate structure G on the substrate 10. Preferably, each gate structure G is composed of a patterned gate dielectric layer 11, a patterned gate material layer 12, and a patterned hard mask layer 13 and despite two gate structures G are disclosed in this embodiment, the quantity of the gate structures G is not limited to two.

The substrate 10 could be a semiconductor substrate including silicon substrate, epitaxial substrate, silicon carbide substrate, or silicon-on-insulator (SOI) substrate, but not limited thereto. The gate dielectric layer 11 could be composed of silicon dioxide ($SiO_2$), silicon nitride, or high dielectric constant material. The gate material layer 12 could be composed of conductive material such as metal, polysilicon, or silicides. The hard mask layer 13 could be composed of silicon dioxide, silicon nitride, silicon carbide, or silicon oxynitride, but not limited thereto. Moreover, the hard mask layer 13 could further include a first hard mask layer and a second hard mask layer, in which each of them could include silicon oxide and silicon nitride.

A plurality of doped wells (not shown) or a plurality of shallow trench isolations (STIs) could also be formed in the substrate 10. Also, it should be noted that even though the fabrication process of this embodiment is applied to a planar type transistor, the fabrication process could also be applied to non-planar transistors such as FinFETs, and in such instance, the element 10 may be a fin-shaped structure on a substrate.

Subsequently, a sidewall spacer 20 is formed on the sidewall of each gate structure G, and a lightly doped implantation process is selectively conducted and then using a rapid thermal anneal process of approximately 930° C. to activate the dopants implanted into the substrate 10. This forms a lightly doped region 30 in the substrate 10 adjacent to two sides of the sidewall spacer 20. More specifically, the sidewall spacer 20 in this embodiment may include a first spacer layer 21 and a second spacer layer 22, the first spacer layer 21 is formed on the sidewall of the gate structures G first, and the second spacer layer 22 is then formed on the first spacer layer 21. The first spacer layer 21 and the second spacer layer 22 are stacked in a horizontal direction D1. The lightly doped region 30 may be formed after the step of forming the first spacer layer 21 and before the step of forming the second spacer layer 22, and the second spacer layer 22 may be directly formed on the substrate 10 accordingly, but the present invention is not limited thereto. In other embodiments of the present invention, the sidewall spacer 20 may be composed of three or more spacer layers, and spacer layers in other shapes may also be applied.

As shown in FIG. 2, an etching process may be conducted by using the gate structure G and the sidewall spacer 20 as mask to etch the substrate 10 along the sidewall spacer 20 for forming a recess T in the substrate 10 adjacent to each of the gate structures G. The etching process may include a single etching process or a multiple etching process so as to vertically etch the substrate 10 uncovered by the gate structure G and the sidewall spacer 20 and to laterally etch the substrate 10 directly under the sidewall spacer 20 for further expanding the volume of the recess T. The recess T in this embodiment may become a circular shaped recess by modifying the process parameters such as the bias power of the etching process. The etching process in this embodiment may be a dry etching process preferably for ensuring that the recess Twill not be turned into a diamond shaped or a hexagonal (or sigma) shaped recess produced by conventional wet etching process.

It is worth noting that, because the volume of the recess T is relatively expanded, a distance between an upmost part of the recess T and the gate structure G adjacent to the recess T (such as a first distance DS1 shown in FIG. 2) in the horizontal direction D1 will be less than a width of the sidewall spacer 20 (such as a third width W3 shown in FIG. 2) in the horizontal direction D1, and an epitaxial layer (not shown in FIG. 2) subsequently formed in the recess T will be closer to the gate structure G and the channel under the gate structure G in a vertical direction D2. In other words, an edge of the topmost part of the recess T is covered by the sidewall spacer 20 in the vertical direction D2. In this embodiment, the edge of the topmost part of the recess T may be covered by the second spacer layer 22, but the present invention is not limited to this. In other embodiments of the present invention, the edge of the topmost part of the recess T may also be covered by the first spacer layer 21 or positioned corresponding to an interface between the first spacer layer 21 and the second spacer layer 22 when the recess T is further expanded laterally.

In this embodiment, the shape of the recess T may be a perfect circle preferably, but not limited thereto. A center CP of the circular shaped recess T is lower than a top surface 10S of the substrate 10, and a width of the circular shaped recess T (such as a fourth width W4 shown in FIG. 2) is equal to twice a radius R of the circular shaped recess T.

After the recess T is formed, a pre-clean process is selectively conducted by using cleaning agent such as diluted hydrofluoric acid or SPM containing sulfuric acid, hydrogen peroxide, and deionized water to remove native oxide or other impurities from the surface of the recess T. As shown in FIG. 3, a buffer layer 41 is then formed in the recess T while covering the surface of the substrate 10 within the recess T. In this embodiment, the buffer layer 41 may include silicon germanium (SiGe) or other suitable materials, and as the buffer layer 41 is conformally grown on the surface of the circular substrate 10 within the recess T, the buffer layer 41 has an even thickness preferably. After the step of forming the buffer layer 41, a selective epitaxial growth process is conducted to form an epitaxial layer 42 on the buffer layer 41. The recess T is filled with the buffer layer 41 and the epitaxial layer 42. In this embodiment, the epitaxial layer 42 may also be composed of silicon germanium, and the germanium concentration of the buffer layer 41 may be substantially lower than the germanium concentration of the epitaxial layer 42, but the present invention is not limited thereto. In other embodiments of the present invention, the buffer layer 41 and/or the epitaxial layer 42 may be composed of other suitable epitaxial materials such as silicon carbide (SiC). Accordingly, a buffering effect could be established between the surface of the recess T and the epitaxial layer 42 thereby reducing structural defect of the epitaxial layer 42. However, in other embodiments of the present invention, the epitaxial layer 42 may also be directly formed in the recess T without forming the buffer layer 41. As shown in FIG. 3, a semiconductor structure 101 may then be obtained by the manufacturing process mention above.

After the semiconductor structure 101 is formed, typical transistor fabrication process could be carried out by forming a main spacer on the sidewall of each gate structure G, and then forming a source/drain region in the substrate 10 adjacent to two sides of the main spacer. Elements including silicides, contact etch stop layer (CESL), and interlayer dielectric (ILD) layer could be formed thereafter, and a replacement metal gate process could also be conducted to transform the gate structures G into metal gates. As these processes are well known to those skilled in the art, the details of which are not explained herein for the sake of brevity.

As shown in FIG. 3, the semiconductor device 101 in this embodiment includes the substrate 10, the gate structure G, the sidewall spacer 20, and the epitaxial layer 42. The gate structure G is disposed on the substrate 10, and the substrate 10 has at least one recess T disposed adjacent to the gate structure G. The sidewall spacer 20 is disposed on at least two sides of the gate structure G. The sidewall spacer 20 includes the first spacer layer 21 and the second spacer layer 22, and the first spacer layer 21 is disposed between the gate structure G and the second spacer layer 22. The epitaxial layer 42 is disposed in the recess T, and the recess T is a circular shaped recess. The distance (such as the first distance DS1) between the upmost part of the recess T and the gate structure G is less than the width (such as the third width) of the sidewall spacer 20. The semiconductor device 101 may further include the buffer layer 41 disposed in the recess T, and the buffer layer 42 is disposed between the epitaxial layer 42 and the substrate 10 in the recess T. The gate structure G may include the gate dielectric layer 11, the gate material layer 12 and the hard mask layer 13. The hard mask layer 13 is disposed on the gate material layer 12, and the sidewall spacer 20 covers at least a part of a side surface 13S of the hard mask layer 13.

As described in the manufacturing method, the volume of the recess is expanded laterally, and a distance between the gate structure G and an upmost part of the epitaxial layer 42 in the recess T adjacent to the gate structure G (such as a second distance DS2 shown in FIG. 3) may be less than the width (such as the third width W3) of the sidewall spacer 20. In other words, the epitaxial layer 42 may become closer to the gate structure G and the channel under the gate structure G without reducing the width (or the thickness) of the sidewall spacer 20 as being formed on the gate structure G, and the performance of the semiconductor device including the semiconductor structure 101 may be improved accordingly.

As shown in FIG. 3, the second spacer layer is directly disposed on the substrate 10 preferably, and the width of the sidewall spacer 20 may be equal to a sum of a width of the first spacer layer 21 (such as a first width W1 shown in FIG. 3) and a width of the second spacer layer 22 (such as a second width W2 shown in FIG. 3) in the horizontal direction D1. The first distance DS1 between the upmost part of the recess T and the gate structure G and the second distance DS2 between the gate structure G and the upmost part of the epitaxial layer 42 in the recess T may be less than the third width W3 of the sidewall spacer 20 and larger than the first width W1 of the first spacer layer 21 in this embodiment, but the present invention is not limited to this. In other embodiments of the present invention, the thickness of the buffer layer 41 and/or the volume of the recess T may be further modified, and the relation between the first distance DS1, the second distance DS2, the first width W1, and the third width W3 may be different accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
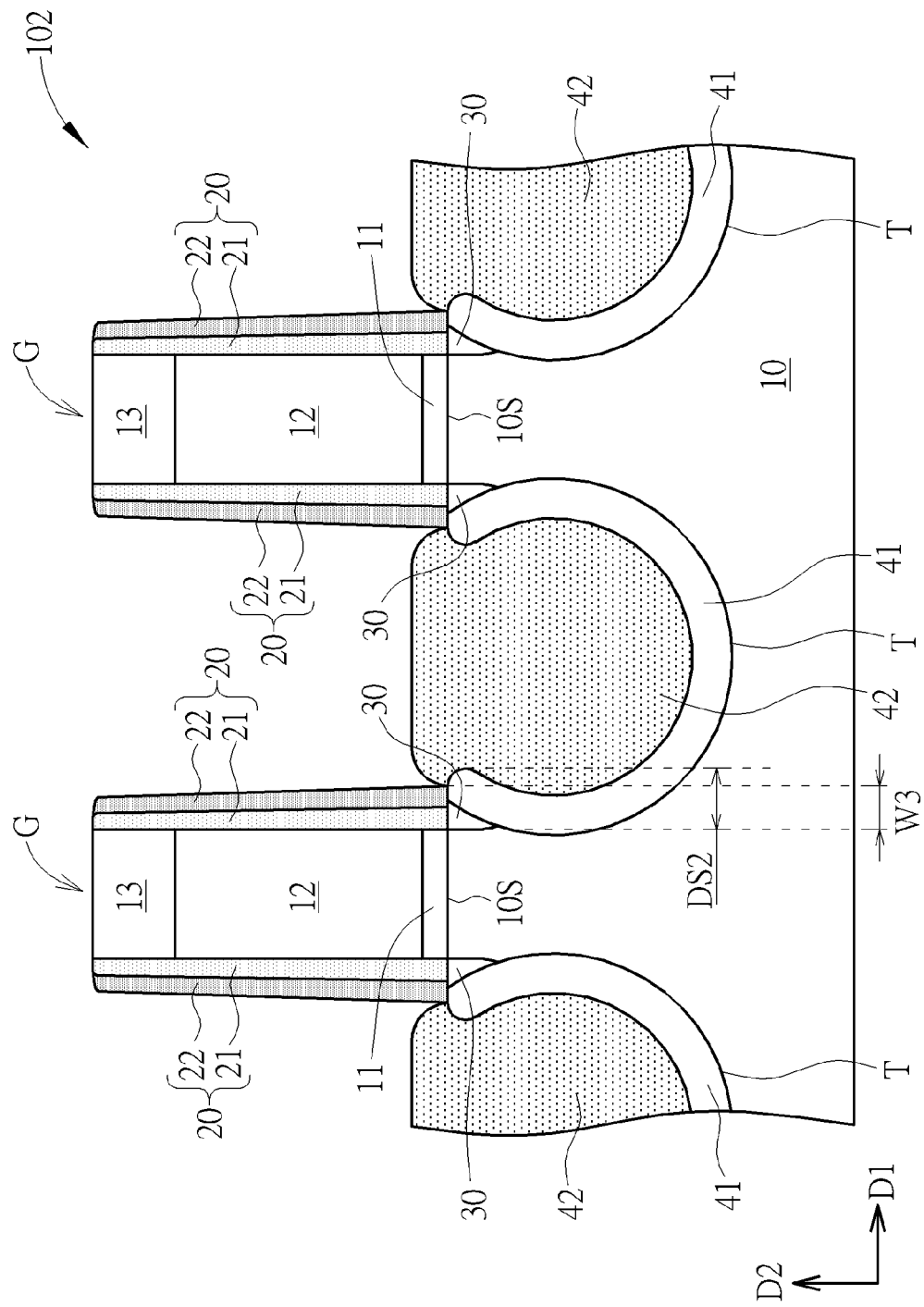
FIG. 4 is a schematic drawing illustrating a semiconductor structure according to a second embodiment of the present invention.

Please refer to FIG. 4. FIG. 4 is a schematic drawing illustrating a semiconductor structure 102 according to a second embodiment of the present invention. As shown in FIG. 4, the difference between the semiconductor structure 102 and the semiconductor structure of the above-mentioned first embodiment is that the buffer layer 41 in this embodiment may become thicker, and an upmost part of the buffer layer 41 in the recess T may extend to be partially uncovered by the sidewall spacer 20 in the vertical direction D2. Therefore, the second distance DS2 between the gate structure G and the upmost part of the epitaxial layer 42 in the recess T may become larger than the third width W3 of the sidewall spacer 20 in this embodiment. The thicker buffer layer 41 in this embodiment may be used to enhance the buffering effect between the surface of the recess T and the epitaxial layer 42.

Figure 5:
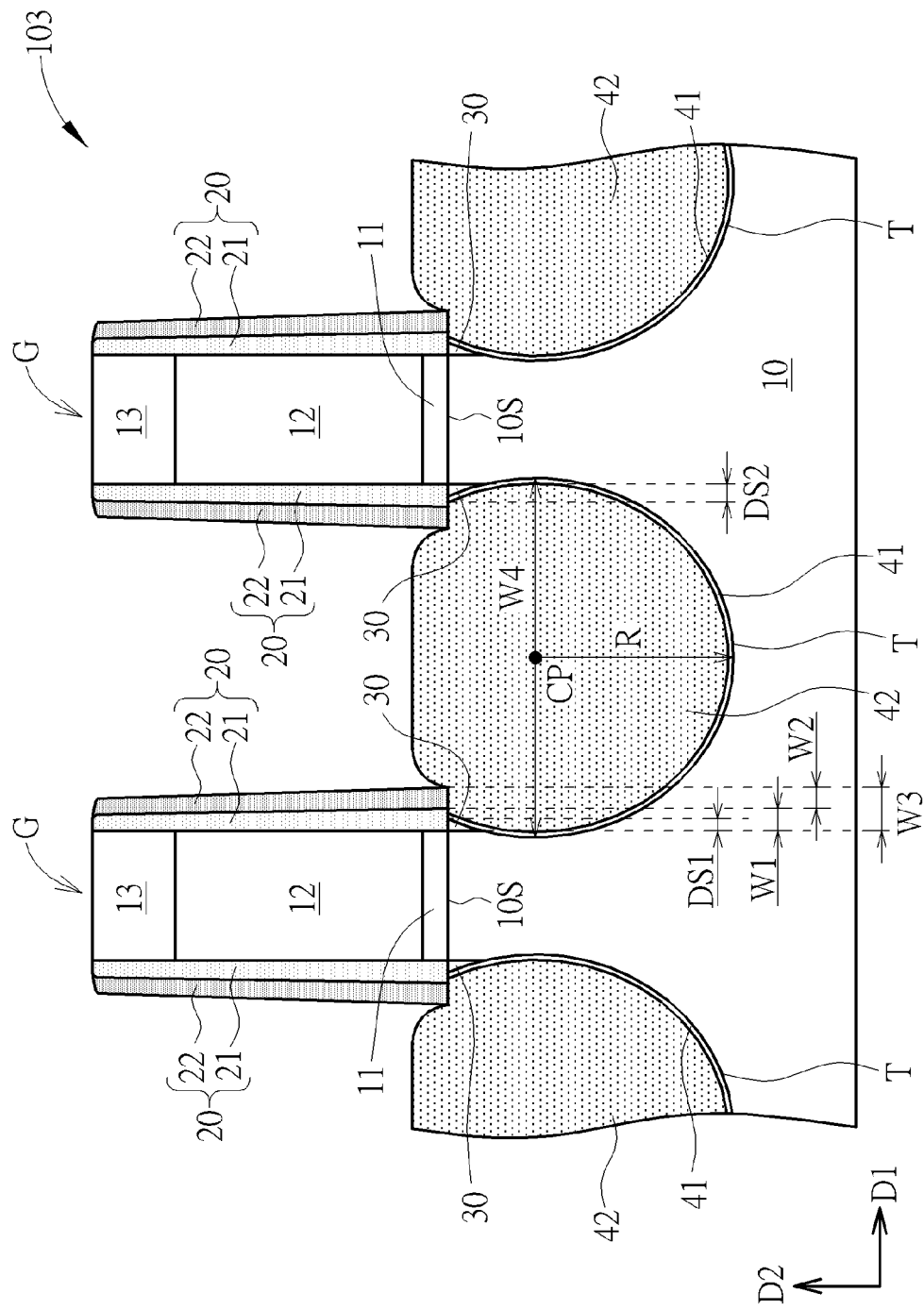
FIG. 5 is a schematic drawing illustrating a semiconductor structure according to a third embodiment of the present invention.

Please refer to FIG. 5. FIG. 5 is a schematic drawing illustrating a semiconductor structure 103 according to a third embodiment of the present invention. As shown in FIG. 5, the difference between the semiconductor structure 103 and the semiconductor structure of the above-mentioned first embodiment is that the recess T is further expanded laterally, and the first distance DS1 between the upmost part of the recess T and the corresponding gate structure G will become less than the first width W1 of the first spacer layer 21. Accordingly, the second distance DS2 between the gate structure G and the upmost part of the epitaxial layer 42 in the recess T is less than the first width W1 of the first spacer layer 21, but not limited thereto. The epitaxial layer 42 in this embodiment may become further closer to the gate structure G and the channel under the gate structure G, and the performance of the semiconductor structure 103 may be improved accordingly.

Figure 6:
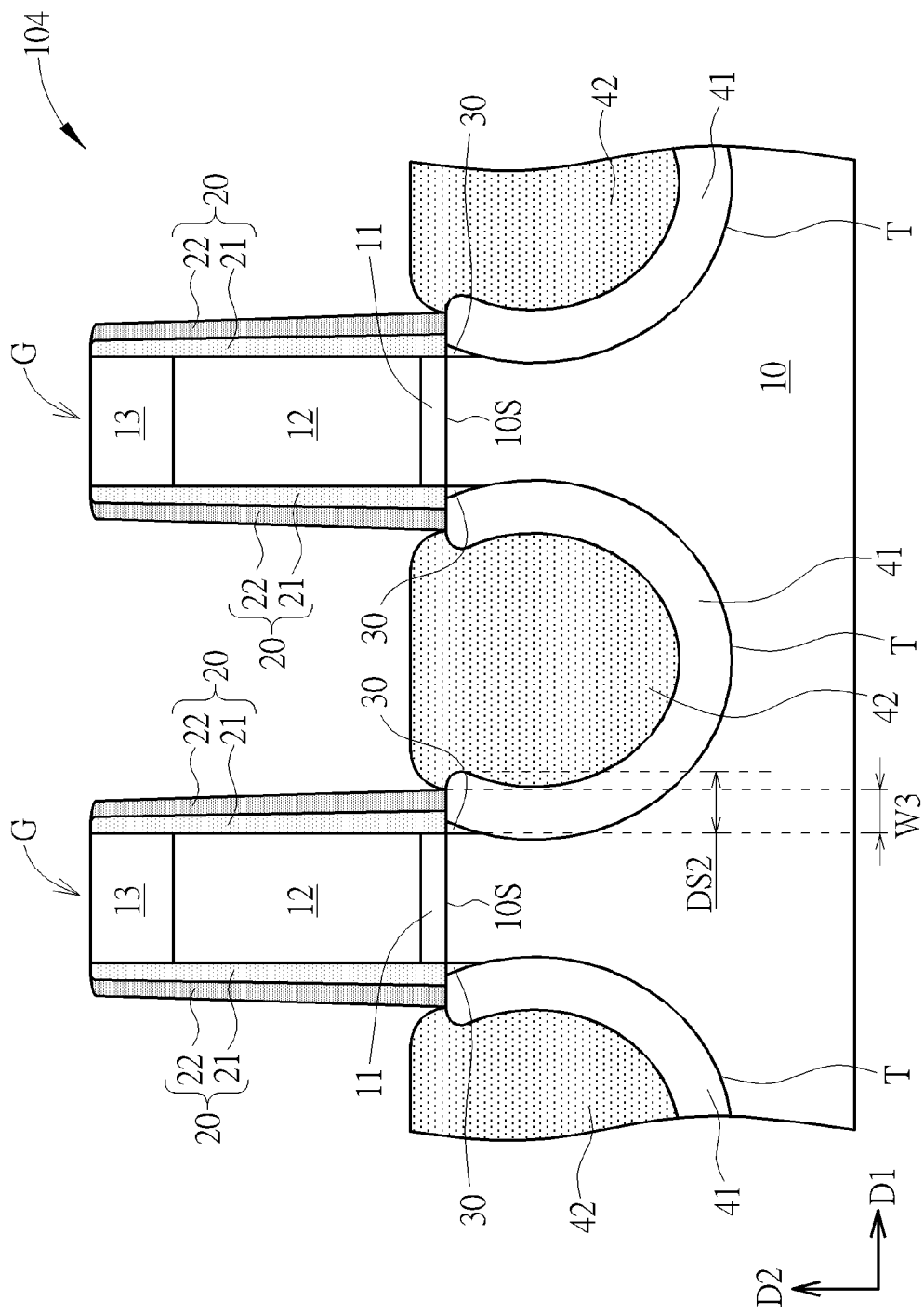
FIG. 6 is a schematic drawing illustrating a semiconductor structure according to a fourth embodiment of the present invention.

Please refer to FIG. 6. FIG. 6 is a schematic drawing illustrating a semiconductor structure 104 according to a fourth embodiment of the present invention. As shown in FIG. 6, the difference between the semiconductor structure 104 and the semiconductor structure of the above-mentioned third embodiment is that the buffer layer 41 in this embodiment may become thicker, and the upmost part of the buffer layer 41 in the recess T may extend to be partially uncovered by the sidewall spacer 20 in the vertical direction D2. Therefore, the second distance DS2 between the gate structure G and the upmost part of the epitaxial layer 42 in the recess T may become larger than the third width W3 of the sidewall spacer 20 in this embodiment.

Figure 7:
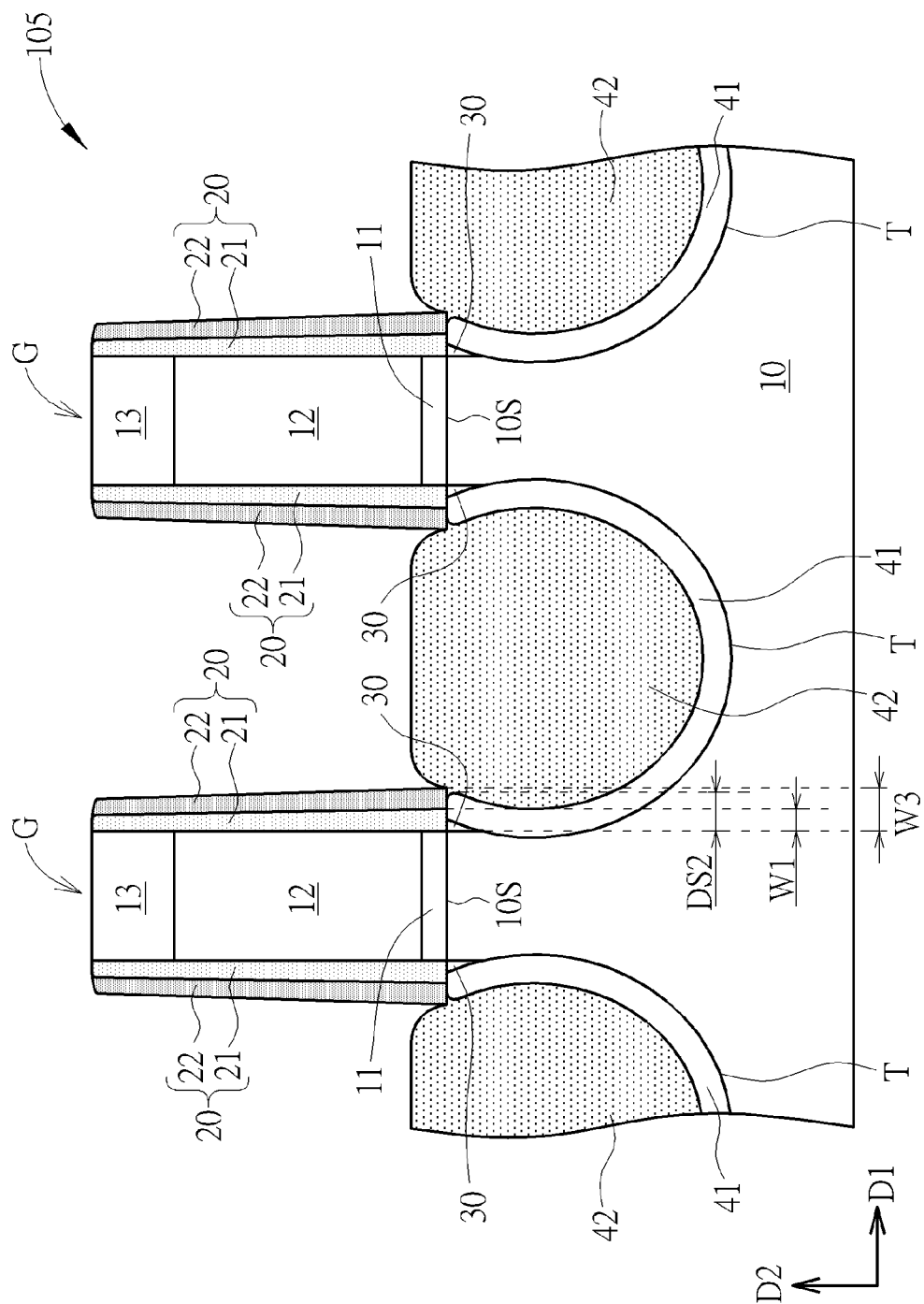
FIG. 7 is a schematic drawing illustrating a semiconductor structure according to a fifth embodiment of the present invention.

Please refer to FIG. 7. FIG. 7 is a schematic drawing illustrating a semiconductor structure 105 according to a fifth embodiment of the present invention. As shown in FIG. 7, the difference between the semiconductor structure 105 and the semiconductor structure of the above-mentioned third embodiment is that the buffer layer 41 in this embodiment may become thicker, the upmost part of the buffer layer 41 in the recess T may extend to be partially uncovered by the first spacer layer 21 in the vertical direction D2, but the upmost part of the buffer layer 41 uncovered by the first spacer layer 21 is still covered by the second spacer layer 22. Therefore, the second distance DS2 between the gate structure G and the upmost part of the epitaxial layer 42 in the recess T may become less than the third width W3 of the sidewall spacer 20 and larger than the first width W1 of the first spacer layer 21. The buffer layer 41 in this embodiment may become thicker for enhance the buffering effect between the surface of the recess T and the epitaxial layer 42 without reducing the volume of the epitaxial layer 42 in the recess T because the recess T is expanded relatively.

Figure 8:
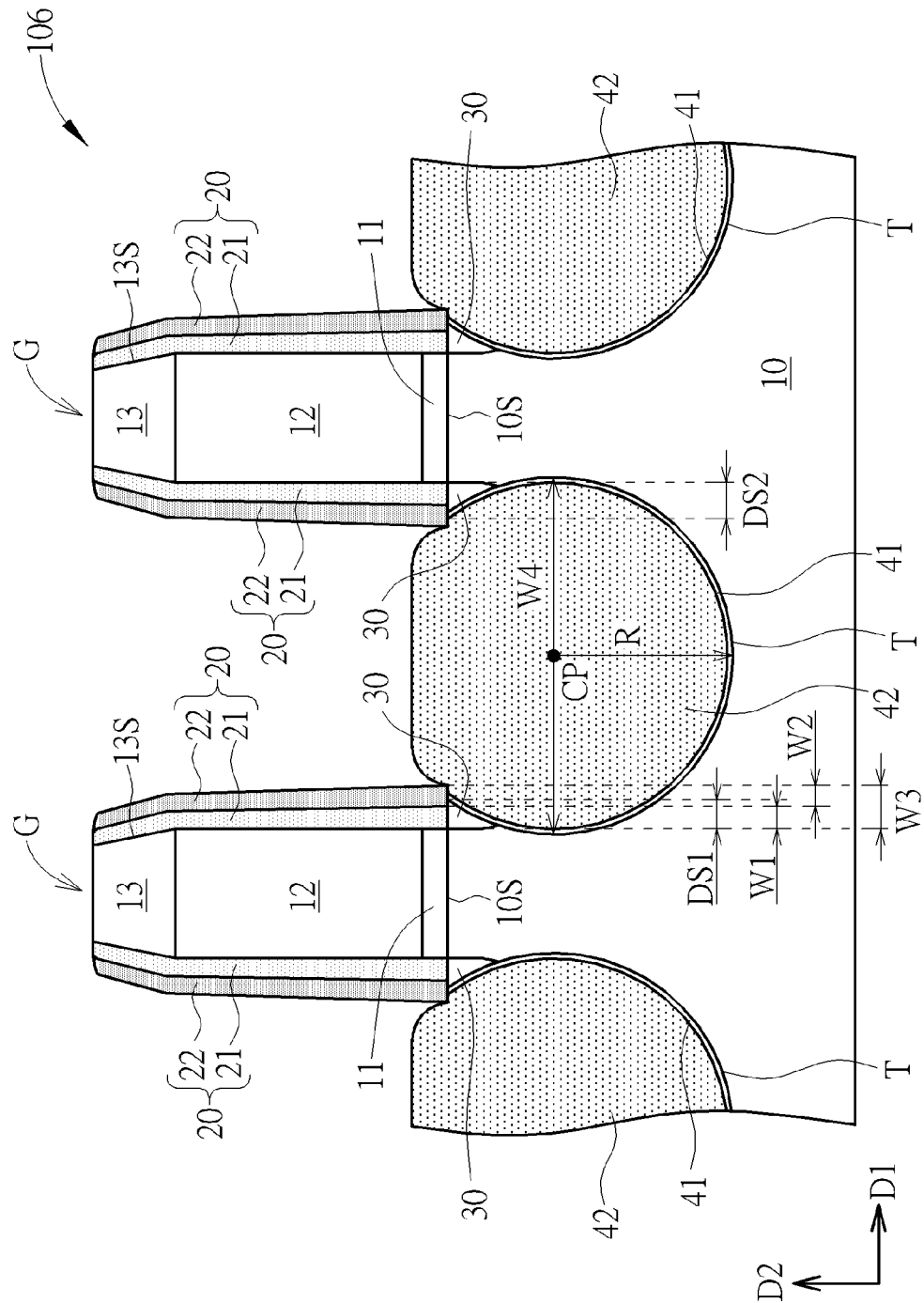
FIG. 8 is a schematic drawing illustrating a semiconductor structure according to a sixth embodiment of the present invention.

Please refer to FIG. 8. FIG. 8 is a schematic drawing illustrating a semiconductor structure 106 according to a sixth embodiment of the present invention. As shown in FIG. 8, the difference between the semiconductor structure 106 and the semiconductor structure of the above-mentioned first embodiment is that the side surface 13S of the hard mask layer 13 may include a tapered surface, and the width of the sidewall spacer 20 may be increased to keep the gate material layer 12 from being exposed in the etching process for forming the recess T because the sidewall spacer 20 on the tapered side surface 13S tends to be etched more quickly in the dry etching process. The size of the recess T and the volume of the epitaxial layer 42 will not be influenced because the edge of the upmost part of the recess T is not aligned with the outmost surface of the sidewall spacer 20. In other words, the third width W3 of the sidewall spacer 20 in this embodiment may be increased for improving the process window without influencing the performance of the semiconductor structure 106. It is worth noting that the tapered side surface 13S of the hard mask layer 13 may also be applied to other embodiments of the present invention, such as the embodiments mentioned above.

Figure 9:
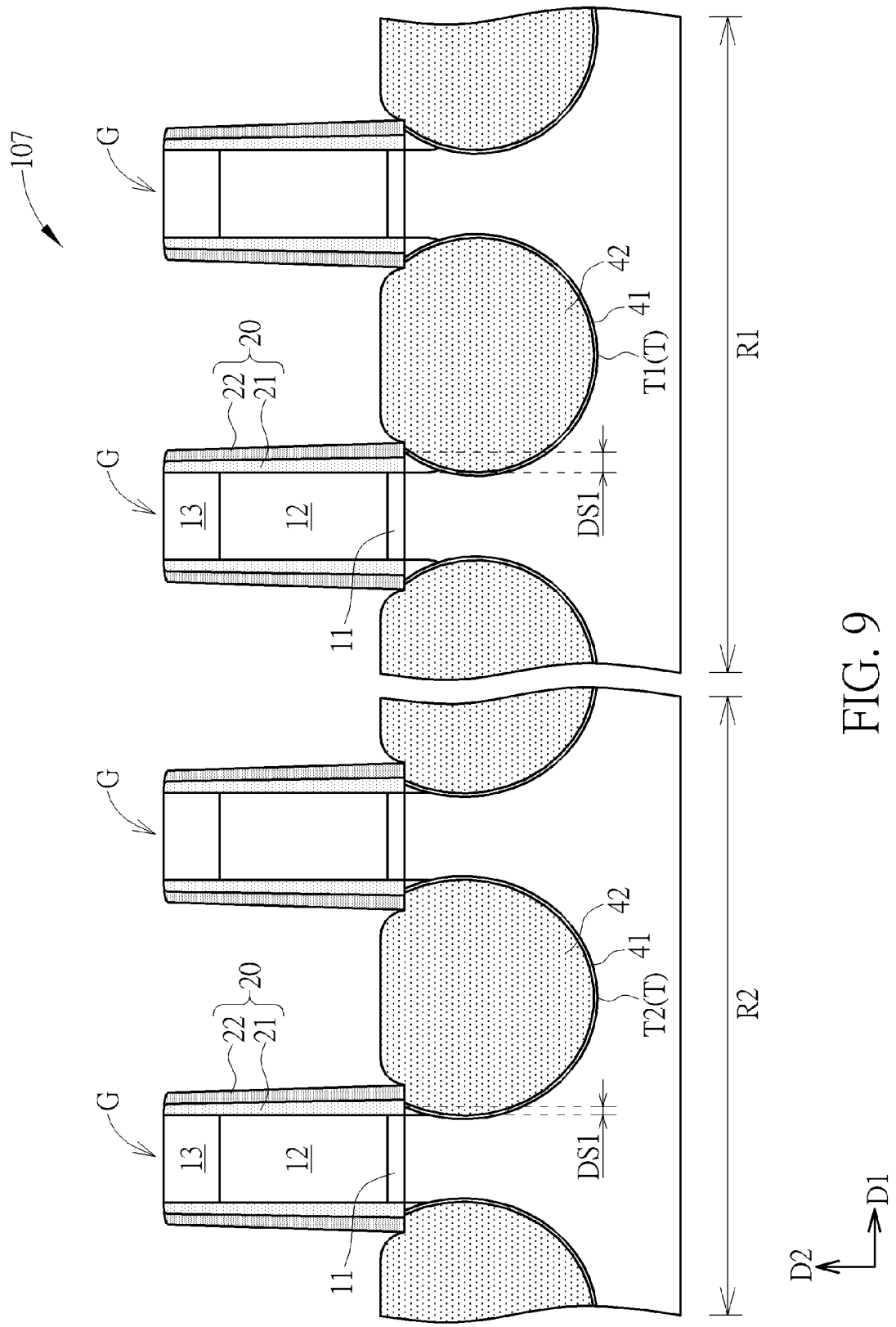
FIG. 9 is a schematic drawing illustrating a semiconductor structure according to a seventh embodiment of the present invention.

Please refer to FIG. 9. FIG. 9 is a schematic drawing illustrating a semiconductor structure 107 according to a seventh embodiment of the present invention. As shown in FIG. 9, in the semiconductor structure 107, a first region R1 and a second region R2 may be defined on the substrate 10, the semiconductor device 107 may include a plurality of the gate structures G disposed in the first region R1 and the second region R2, and the substrate 10 may have a plurality of the recesses T disposed adjacent to the gate structures G in the first region R1 and the second region R2. The first distance DS1 between the upmost part of the recess T (such as a first recess T1 shown in FIG. 9) and the corresponding gate structure G in the first region R1 is different from the first distance DS1 between the upmost part of the recess T (such as a second recess T2 shown in FIG. 9) and the corresponding gate structure G in the second region R2. For example, the condition of the semiconductor structure 107 in the first region R1 may be similar to the condition of the first embodiment mentioned above, and the condition of the semiconductor structure 107 in the second region R1 may be similar to the condition of the third embodiment mentioned above. As shown in FIG. 9 and FIG. 3, the first distance DS1 between the upmost part of the first recess T1 and the corresponding gate structure G in the first region R1 may be less than the third width W3 of the sidewall spacer 20 and larger than the first width W1 of the first spacer layer 21. As shown in FIGS. 9 and 5, the first distance DS1 between the upmost part of the second recess T1 and the corresponding gate structure G in the second region R1 may be less than the first width W1 of the first spacer layer 21. In other words, the volume of the epitaxial layer 42 in the first recess T1 may be different from the volume of the epitaxial layer 42 in the second recess T2. The first region R1 and the second region R2 may be used to form field effect transistors with different conductivity types respectively. For example, the first region R1 may be a PMOS region, and the second region R2 may be an NMOS region, but not limited thereto.

To summarize the above descriptions, in the semiconductor structure of the present invention, the distance between the epitaxial layer and the gate structure is reduced and the volume of the epitaxial layer in the recess is increased because the recess is expanded laterally and the distance between the upmost part of the recess and the gate structure is less than the width of the sidewall spacer. The strain of the gate channel becomes higher and the performance of the semiconductor structure is enhanced accordingly without reducing the width of the sidewall spacer. Additionally, the buffer layer in the recess may become thicker for enhance the buffering effect between the surface of the recess and the epitaxial layer without reducing the volume of the epitaxial layer in the recess because the recess is expanded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a gate structure disposed on the substrate, wherein the substrate has at least one recess disposed adjacent to the gate structure;
a sidewall spacer disposed on at least two sides of the gate structure, wherein the sidewall spacer comprises a first spacer layer and a second spacer layer, and the first spacer layer is disposed between the gate structure and the second spacer layer;
an epitaxial layer disposed in the recess, wherein the recess is a circular shaped recess, and a distance between an upmost part of the recess and the gate structure is less than a width of the sidewall spacer; and
a buffer layer disposed in the recess, wherein the buffer layer is disposed between the epitaxial layer and the substrate, and an upmost part of the buffer layer in the recess extends to be partially uncovered by the sidewall spacer.

2. The semiconductor device of claim 1, wherein the distance between the upmost part of the recess and the gate structure is less than a width of the first spacer layer.

3. The semiconductor device of claim 1, wherein the buffer layer has an even thickness.

4. The semiconductor device of claim 1, wherein the buffer layer and the epitaxial layer comprise silicon germanium, and the germanium concentration of the buffer layer is lower than the germanium concentration of the epitaxial layer.

5. The semiconductor device of claim 1, wherein the recess is filled with the buffer layer and the epitaxial layer.

6. The semiconductor device of claim 1, wherein a distance between the gate structure and an upmost part of the epitaxial layer in the recess is larger than the width of the sidewall spacer.

7. The semiconductor device of claim 1, wherein the second spacer layer is directly disposed on the substrate.

8. The semiconductor device of claim 1, wherein a center of the circular shaped recess is lower than a top surface of the substrate.

9. The semiconductor device of claim 1, wherein a width of the circular shaped recess is equal to twice a radius of the circular shaped recess.

10. The semiconductor device of claim 1, wherein the gate structure comprises a gate material layer and a hard mask layer disposed on the gate material layer, and the sidewall spacer covers a side surface of the hard mask layer.

11. The semiconductor device of claim 10, wherein the side surface of the hard mask layer comprises a tapered surface.

12. The semiconductor device of claim 1, wherein a first region and a second region are defined on the substrate, the semiconductor device further comprises a plurality of the gate structures disposed in the first region and the second region, and the substrate further has a plurality of the recesses disposed adjacent to the gate structures in the first region and the second region, wherein a distance between the upmost part of the recess and the corresponding gate structure in the first region is different from a distance between the upmost part of the recess and the corresponding gate structure in the second region.

* * * * *